United States Patent [19]

Karner et al.

[11] Patent Number: 5,336,326

[45] Date of Patent: Aug. 9, 1994

[54] METHOD OF AND APPARATUS FOR A DIRECT VOLTAGE ARC DISCHARGE ENHANCED REACTIVE TREATMENT OF OBJECTS

[75] Inventors: Johann Karner, Feldkirch, Austria; Erich Bergmann, Mels, Switzerland

[73] Assignee: Balzers Aktiengesellschaft, Furstentum, Liechtenstein

[21] Appl. No.: 757,712

[22] Filed: Sep. 11, 1991

[30] Foreign Application Priority Data

Sep. 14, 1990 [DE] Fed. Rep. of Germany ....... 4029268

[51] Int. Cl.$^5$ ............................................. C23C 16/50
[52] U.S. Cl. .......................... 118/723 HC; 118/723 E; 118/715; 118/666
[58] Field of Search ............ 118/723, 723 HC, 723 E, 118/723 ER, 719, 715, 663, 666; 156/345

[56] References Cited

U.S. PATENT DOCUMENTS

| | | |
|---|---|---|
| 4,731,255 | 3/1988 | Maeda et al. |
| 4,749,587 | 6/1988 | Bergmann et al. ................... 427/37 |
| 4,851,254 | 7/1989 | Yamamoto et al. .................. 427/37 |
| 4,859,490 | 8/1989 | Ikegaya et al. ..................... 427/38 |

FOREIGN PATENT DOCUMENTS

| | | |
|---|---|---|
| 0115970 | 8/1984 | European Pat. Off. |
| 0364215 | 10/1989 | European Pat. Off. |
| 3830249 | 9/1988 | Fed. Rep. of Germany . |
| 2397067 | 7/1977 | France . |
| 60-63919 | 4/1985 | Japan . |
| 58-9324 | 6/1986 | Japan . |
| 32078591A | 9/1991 | Japan ..................................... 118/723 |
| 664768 | 3/1988 | Switzerland . |

| | | |
|---|---|---|
| 2178228A | 4/1987 | United Kingdom . |
| 2176808A | 7/1987 | United Kingdom . |

OTHER PUBLICATIONS

Patent Abstracts of Japan, vol. 9, No. 271 (C-311) (1994), Oct. 29, 1985.

Primary Examiner—R. Bruce Breneman
Assistant Examiner—Jonathan D. Baskin
Attorney, Agent, or Firm—Louis Weinstein

[57] ABSTRACT

An apparatus for a reactive treatment of the surface of a workpiece, in which a process gas is brought into a chamber and a direct voltage arc discharge is generated in the chamber, the arc discharge is assisted or maintained, respectively by introducing a flow of charged particles. In known treatment methods, plasma generated in the direct voltage arc are generally distributed non-homogeneously in the inner space of the chamber and the area with a density of the plasma which is sufficient for the reactive surface treatment is relatively small. According to the invention this problem is solved in that the distribution of the effect of the treatment of the plasma in the chamber at least along a predetermined plane is set, and specifically by a distribution of openings for the process gas over a given area and/or by a distribution of the arc discharges in the chamber over a given area. The flow of charged particles enters into the chamber via a plurality of distribution openings. By such an arrangement, spatially large plasmas having high densities of ionization and acceptable densities of energy are realized, and it is possible to perform treatment of large surface areas and also treatment processes on objects which are thermally sensitive.

36 Claims, 5 Drawing Sheets

METHOD OF AND APPARATUS FOR A DIRECT VOLTAGE ARC DISCHARGE ENHANCED REACTIVE TREATMENT OF OBJECTS

BACKGROUND OF THE INVENTION

1. Field of the Invention

The present invention refers to a method of a direct voltage arc discharge enhanced treatment of at least portions of the surface of an object. A gas or gas mixture, referred to hereinbelow as a process gas, adapted to react at least partly, is fed into an evacuated main chamber containing an object to be treated. Gaseous reaction products are drawn off from the chamber and a direct voltage arc discharge is maintained in the chamber to provide a flow of charged particles.

The invention also refers to a vacuum treatment arrangement employing a vacuum chamber, and inlets for receiving a process gas introduced at least in part to react in a main chamber within the vacuum chamber. A draw-off (i.e. exhaust) arrangement is provided for removal of gaseous reaction products. An opening is provided for introducing a flow of electrically charged particles into the main chamber, and an electrode arrangement is provided for generating a direct voltage arc discharge in the main chamber.

2. Description of the Prior Art

A method and apparatus of the kind mentioned above are disclosed in Swiss Specification CH-A-664,768. In addition, U.S. Pat. No. 4,851,254 discloses a method for a reactive plasma enhanced coating of objects, in which a direct voltage arc discharge is maintained in a vacuum chamber between two closely spaced electrodes, which arc discharge operates at a low voltage, for example, below 100 V and at relatively high arc currents in the range between 50 A and 100 A.

The object to be coated is placed outside of the cathode/anode space in an insulated manner and is arranged parallel to the arc discharge. A process gas which reacts at least partly is jetted into the plasma through a pipe conduit located opposite the object to be treated with respect to the anode/cathode space.

In plasma chemical methods the reaction space is substantially limited to a region surrounding the plasma zone the extent of which is the length of the free path of the gas. The latter value is inversely proportional to the value of the pressure. A lowering of the pressure in order to increase the size of the reaction space is, however, generally not possible, because the concentration of the reactant gases obviously also decreases when the pressure is lowered.

Therefore, this procedure is deficient in that only small surfaces of the object can be coated, due to the small surface area which is adjacent the short anode/cathode space, and due to the point-like size of the jets of reactive process gas entering the chamber.

A further procedure of a reactive, plasma enhanced coating (PECO) is disclosed in U.S. Pat. No. 4,859,490. The apparatus disclosed therein includes a freely accessible glowing cathode coil, a screen connected relative thereto which is maintained at a positive, anodic potential, and an electrode located opposite the screen relative to the glowing cathode and connected cathodically relative to the screen supporting the object to be treated.

Gas, which predominantly reacts in the plasma generated in the region between the glowing coil and the screen is jetted into the central part of the main chamber and against the glowing cathode coil. A drawback of this procedure is that the reactive gas must first flow through the glowing coil and thus reacts with the glowing coil. The effect thereof is that on the one hand the coating process of the object may be disturbed by the coil and on the other hand the useful operating life of the glowing coil is drastically reduced.

An example of such a condition is the deposition of diamond coatings from hydrocarbon/hydrogen mixtures. The carburization of the filaments of refractory metal for such arrangements proceeds at such a high speed that such filaments fail due to breaking after one to three coating cycles. From the viewpoint of a controlled industrial production this is unacceptable. Similar problems are encountered in other gases such as the formation of scaling or the forming of hydrides or silicides.

The drawbacks of the method and apparatus disclosed in U.S. Pat. Nos. 4,851,254 and 4,859,490 are overcome by the procedure according to Swiss Patent No. CH-A-664,768 mentioned above, in that it is known from this document to generate a low voltage direct voltage (d.c.) arc discharge between an anode and a cathode so that electrically charged particles, electrons and ions, are fed into the discharge space making it possible to maintain an arc at low arc voltages between anode and cathode electrodes, which electrodes are separated by quite a large distance from each other compared with the separation distance according to U.S. Pat. No. 4,851,254.

In contrast to U.S. Pat. No. 4,859,490, for example, the thermally emitted electrons are not generated in the main chamber but are generated outside of the main chamber and are coupled into the main chamber through an opening arrangement, and contamination of the treatment by the material of the hot coil or the reduction of the useful operating life thereof, respectively by the treatment process is also remedied.

The drawback of the procedure according to Swiss Specification CH-A-664,768 is that in the edge area of the treatment chamber a linear jetting-out of process gas with gas is produced, or that an non-homogeneous discharge or distribution of plasma occurs in the inner space of the main chamber seen over its volume.

In many coating methods this is disturbing to such an extent that it prevents practicing of such methods. Every plasma-chemical reaction necessitates a certain plasma density, i.e. a minimal space density of charge carrying particles in which the reaction proceeds.

In the arrangement according to Swiss Specification CH-A-664,768 the space density decreases rapidly in the radial direction. An increase of arc power does not always solve this problem. The heating up of the substrates in the arc plasma is supplied predominantly by convection. The radial extent thereof is unrestricted. An increase in power causes a substantially large increase in thermal loading on the substrates than of the plasma density which is needed for deposition.

SUMMARY OF THE INVENTION

It is a general object of the invention to eliminate the above-mentioned drawbacks which occur when using the last-described advantageous method for generation of an arc.

This object is achieved by use of a method of a direct voltage arc discharge assisted reactive treatment as mentioned above in which the distribution of the effect of the treatment at least along a predetermined area in the reaction space is at least partly determined by providing a given distribution of the process gas inlets over a given area and/or in which the distribution of the effect of the treatment at least along a predetermined area in the reaction space is at least partly determined by providing at least a two dimensional distribution of arc discharges in a given area in the main chamber.

A further object is to provide a vacuum treatment arrangement as mentioned above in which the inlet arrangement for the process gas includes a plurality of inlet openings distributed over a given area and/or in which the arrangement of openings for the flow of charged particles includes a plurality of distributed openings communicating with the inner space of the main chamber for the generation of arc discharges distributed over at least a two-dimensional area.

Preferred embodiments of the inventive methods and apparatus are set forth in the appended claims.

It must specifically be noted that by generating a spatially distributed low voltage arc discharge externally of the electrically charged particles generated in the main chamber and their coupling into the anode/cathode space of the main chamber it is possible to realize spatially spread plasmas of a high density of ions and an acceptable density of the energy, such as, for example, at arc voltages $<150$ V arcs over spaces or gaps larger than 30 cm. This is accomplished at current densities of several 100 A per $m^2$ up to more than several kA per $m^2$ at the anode/cathode surfaces. Temperatures of less than 900° C. are obtained in the plasma, and more particularly temperatures of 800° C. and less are obtained. When combined with a distributed inlets for introducing process gas into the treatment chamber, the treatment of large surface areas of objects or of a plurality of objects is obtained. Due to the relatively low temperatures and the high density of energy, it is possible to treat objects which are critical as concerns thermal loading, which processes were hardly possible up to now or were obtainable only with the use of excessive cooling.

BRIEF DESCRIPTION OF THE DRAWINGS

The invention will be better understood and the above as well as other objects of the invention will become apparent upon consideration of the following detailed description, making reference to the annexed drawings wherein.

DESCRIPTION OF THE PREFERRED EMBODIMENTS

Figure 1:
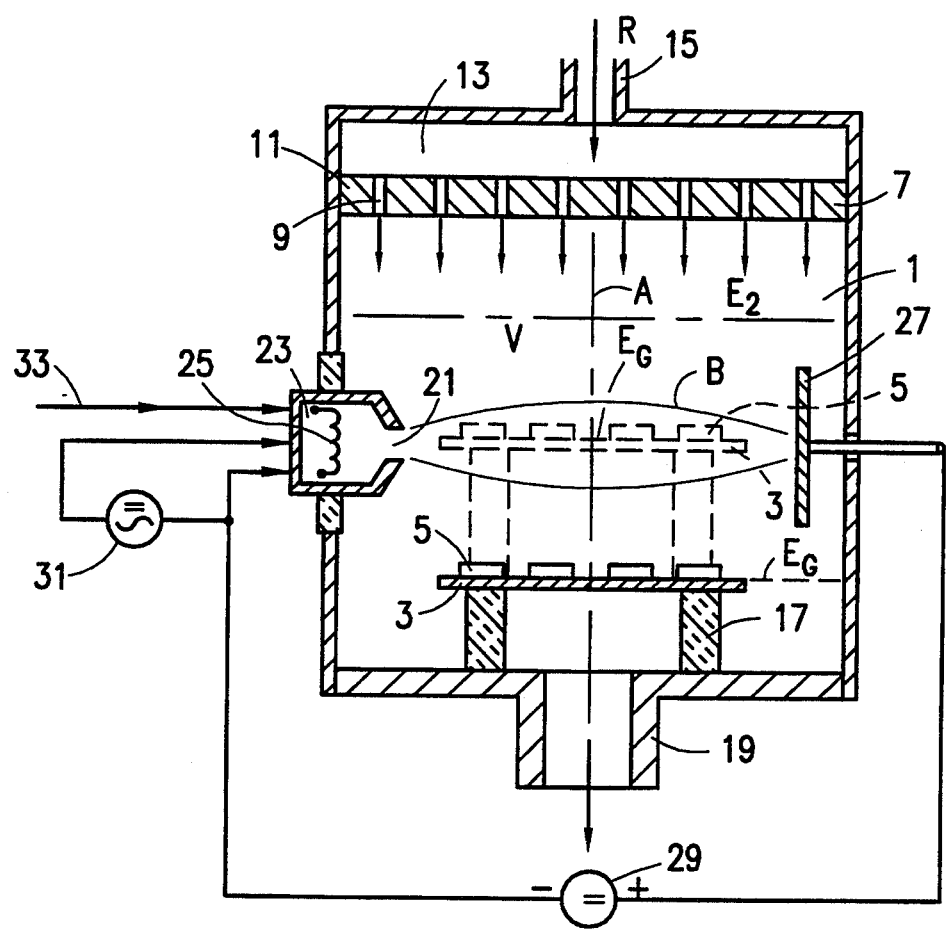
FIG. 1 is a schematic drawing showing a first embodiment for practicing the inventive method and an arrangement therefor.

FIG. 1 illustrates schematically a first embodiment of an inventive treatment chamber for explaining a first variant of an embodiment of the inventive procedure.

The object 5 to be treated, in the form of one or a plurality of workpieces, is positioned on a support 3 in a vacuum treatment chamber. The support 3 comprises a supporting surface, such as a supporting plane $E_G$. In chamber 1, opposite support 3 and plane $E_G$ is an inlet arrangement 7 for a process gas or process gas mixture R with reaction gas or a reaction gas mixture.

The inlet arrangement 7 includes a two-dimensional arrangement such as an arrangement of inlet openings 9 in a plate 11 and being distributed over a given area of plate 11. The openings 11 are supplied with gas from a pressure equalizing chamber 13 separated from the reaction space V in chamber 1 by plate 11. Chamber 13 is, in turn, supplied with gas by one or more gas supply lines 15.

Support 3 is a table-like support and is supported by insulation means 17 supported on a bottom wall of chamber 1. A draw-off (i.e. exhaust) line 19 located below support 3 is provided for initially evacuating chamber 1 and for drawing off gaseous reaction products or consumed process gas during the treatment process.

A hot cathode chamber 23 communicates through an orifice opening 21 with the reaction space V of chamber 1. A directly or indirectly heated hot cathode 25 is located in chamber 23. An anode 27 is arranged in chamber 1 opposite orifice opening 21.

A d.c. voltage for maintaining arc discharge is applied by means of a direct voltage generator 29 coupled across hot cathode 25 and anode 27. Electrical heating of the hot cathode 25 is obtained by means of a generator 31. Generator 31 can be a direct (d.c.) or alternating (a.c.) current generator, and may include an isolating transformer for connecting its output to coil 25.

In principle any structural form is suitable for the cathode of the arc discharge so long as it is capable of supply a sufficiently high current at stable operating conditions. Specifically, the ionization chamber 23 can be replaced by a hollow cathode.

Figure 1A:
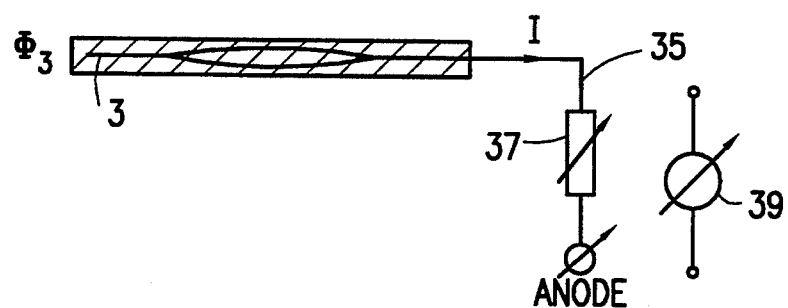
FIG. 1a schematically illustrates an inventive temperature control method for adjusting temperature of an object by adjusting the temperature of a support for an object to be treated as shown in FIG. 1.
Figure 1B:
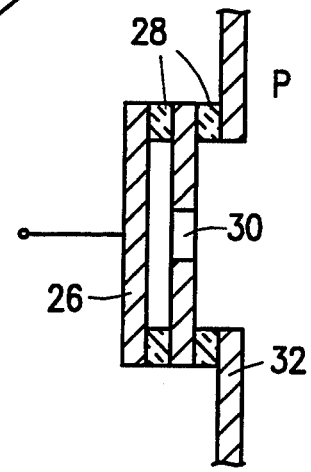
FIG. 1b illustrates schematically a sectionalized portion of the arrangement of FIG. 1 employing a modified spark chamber.

In a different embodiment the ionization chamber may be a spark chamber, as is schematically illustrated in FIG. 1b. Details of the design of such a structure are known from vapor deposition techniques employing such a structure and which are already in practical use, for instance as disclosed in German Specification DE-OS 34 13 701, which reference for reasons of the disclosure is herewith specifically incorporated herein by reference thereto. FIG. 1b illustrates schematically such a spark chamber with a water cooled cathode 26, insulation 28, orifice 30 and a chamber wall 32. The anode is likewise located in the chamber.

The orifice 30 (or 21) which separates the cathode chamber and also the spark chamber from space B must be designed in such a manner that no metal vapor exits out of the cathode chamber into the depositing or coating chamber, and that the electrons find their way to (i.e. are directed to) the anode in the coating chamber.

The volume of the pressure equalizing chamber 13 is such that a uniform distribution of the gas supplied through the line 15 relative to the inlet openings 9 therein is obtained, and by distribution of the inlet openings, their flow cross-sections and their axial lengths, thus via their flow resistances and the direction of their outflow, a desired, substantially directed distribution of the inflow of the gas into the chamber 1 is obtained.

In the illustrated example a substantially uniform gas outflow directed towards support 3 is achieved by an equal-spaced distribution and uniform design of the openings 9 along the plate 11. The process gas entering the reaction space V reacts therein and divides partly into a portion which increases over time and at least another portion which is used or consumed process gas that is drawn off through the line 19.

Due to the distributed process gas inlet arrangement 7 and the drawing-off line 19 located at a substantially central location relative to inlet arrangement 7, substantially the same ratios of not yet consumed process gas to consumed process gas are achieved in the reaction space V along the dot-dash line which represents plane(s) $E_2$. Because the object to be treated is positioned by the support 3 on such a plane, a uniform distribution of the treatment effect, at least onto surface areas of the objects which are equidistant from this plane, is realized.

Due to the direction and design of inlet openings 9 and the arrangement of line 19, the shape of the said equi-distribution surface (surfaces) $E_2$ is (are) substantially determined, which surfaces or areas $E_2$ in the illustrated example are planes extending parallel to each other. Because an arc discharge B is maintained in a small volume area only, its effect is not the same in the entire reaction space V.

There are coating applications where a non-uniform distribution of plasma of the arc discharge B can be compensated by an aimed non-uniform gas inlet or where it is of no importance because the treating process is performed with a large excess of reaction gas. In such a case it is only necessary to either balance or equalize the non-uniform distribution of the coating which, in the case of small objects, is performed by means of a rotating basket with planetary spindles upon which the objects are supported.

At least the internal surfaces of chamber 1 are preferably formed of a material which does not have a negative influence upon the treatment process. One such material is stainless steel. In specific cases at least predominant parts of chamber 1 can consist of quartz glass or a ceramic material.

The support 3 and thus the objects being treated are preferably, and according to one variant, not connected to a selected electric potential but, by use of the insulating supports 17, are operated at a floating potential. Thus, an electrical floating potential can be established thereon in accordance with the distribution of the electric potential in the reaction space V. By this arrangement the treatment temperature of the objects is lowered, in contrast to the case where the objects are held at an anodic potential, such as at anode potential.

In this fashion a controlled treatment of a large surface area of an object is possible by using a reactive arc plasma enhanced method. The arc discharge generated in accordance with the described procedure is a long low-voltage discharge which is maintained at pressures of only a few $P_a$ with a low d.c. voltage, for example, below 150 V, and typically at voltages on the order of the ionization energy of the process gas mixture.

In order to prevent gases entering the reaction space from contacting the hot electrode 25 the material of which could influence the treatment process and would also react, causing the lifespan of electrode 25 to be drastically reduced, a scavenging gas is preferably fed into the cathode chamber 23, for example, through a conduit 33. The pressure in the cathode chamber 23 can thereby be set somewhat higher than the process pressure in the reaction space V so that a gas flow out of the chamber is obtained.

An important matter during operation of low voltage discharges by hot cathodes is that an electrically neutral plasma flow exits from the ionization chamber into the coating chamber, and thus an equal number of ions and of electrons is obtained. In any case, a process compatible gas is introduced as scavenging gas, usually a noble gas.

The low voltage arc generates a plasma with a relatively low gas temperature—at a high electron temperature, said temperature being on the order of 200° C. to 1000° C. This allows an object (or objects) to be placed between the cathode and the anode which, as illustrated by broken lines is extremely advantageous for treatment processes which call for a high plasma density at low object temperatures.

FIG. 1a schematically illustrates a part of the support 3 of FIG. 1. As was mentioned hereinabove, due to the floating electrical potential mounting of the support 3 an electrical potential $\Phi_3$ corresponding to the distribution of the electrical potential in the reaction space V is established. According to a further embodiment of the arrangement illustrated in FIG. 1 support 3 is preferably connected by a current branch 35 and a resistance element 37 to a reference potential, for example, anode potential. A potential difference depending upon the impedance conditions in the reaction chamber V and the value of the resistance element 37 is established and the current I driven therethrough is used to adjust the temperature of the support and thus the object (or objects) supported thereon.

Alternatively, the potential of an object can be adjusted independently of the arc current by an adjustable voltage source 39 set at a value between the anode and cathode potentials in the space V. Both of these procedures are specifically suitable for fine adjusting or feedback controlling of the temperature of the object. For adjusting the "heating current"—value I, the value of the resistance is adjusted about an operating point.

The temperature of the object may also be adjusted by adjusting the potential of the object, decoupled from the discharge.

For some processes it is also advantageous to bombard the growing coating with electrons. Open-loop control or feedback control of the applied flow of electrons proceeds in an analogous manner: The current I which flows off is a measure of the flow of electrons; it can be respectively influenced by resistance or by a direct shifting of the potential at the substrate.

In order to provide feedback control of the temperature, the temperature of the support 3 is measured and, such as is quite obvious to a person skilled in the art, an electrical signal which corresponds to the measured value is compared with a design or reference or rated value, and the resistance value of the resistance element 37 and/or the voltage value at the voltage source 39, acting as respective adjustment elements are adjusted in a feedback controlled manner.

By varying the reference value during the treatment process, the temperature of the object being treated can be made to follow a preset time characteristic in the sense of a master feedback control.

Departing from the arrangement according to FIG. 1 the following further development or embodiment steps can be derived:

in place of or in addition to a predetermined distribution of operating gas inlets, a predetermined distribution of the long low voltage arc discharge is generated;

a considerable the increase in exploitation of the volume of the reaction space V is obtained by arranging objects to be treated on a plurality of distribution surfaces $E_2$.

It is not necessary that exhaust line 19 be centrally located, it may be located near the periphery of chamber 1 and/or in a distributed manner along the bottom wall.

Figure 2:
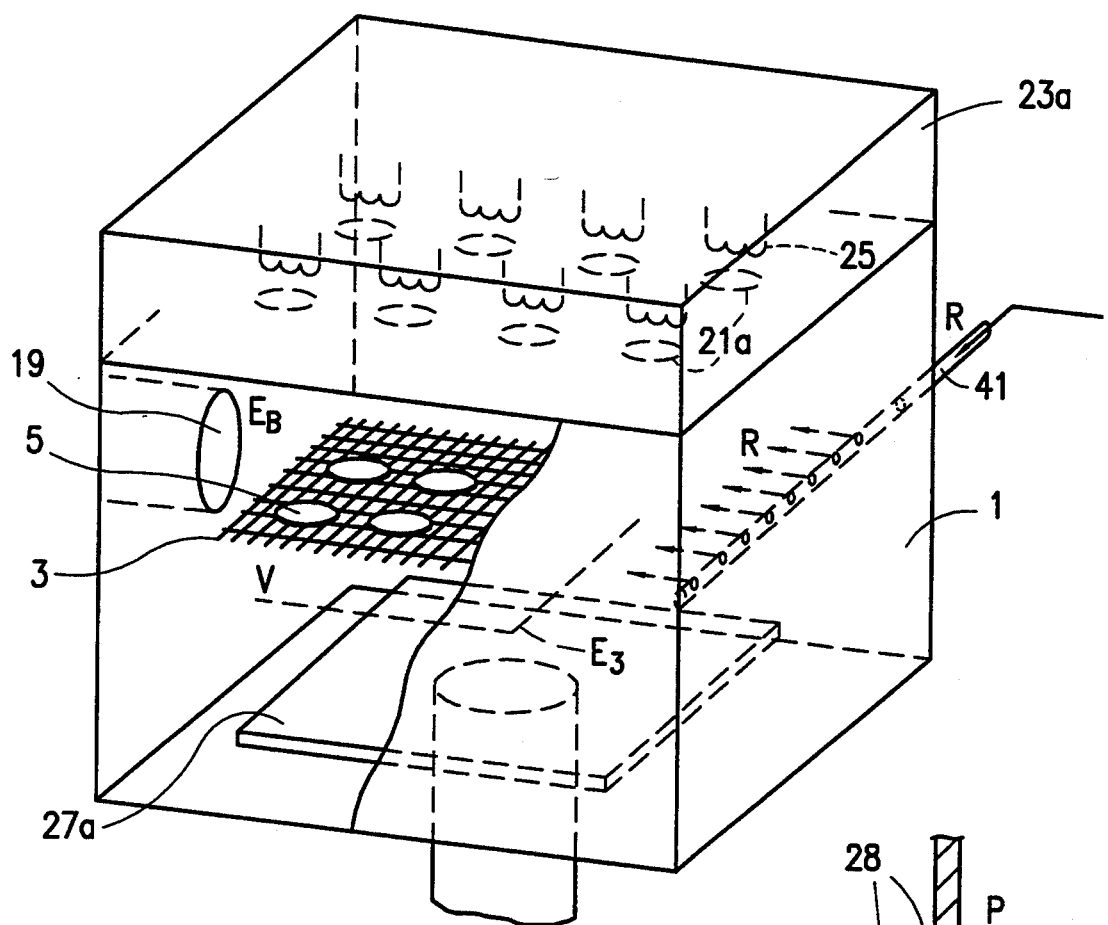
FIG. 2 illustrates schematically a second embodiment for practicing the inventive method and an arrangement therefor.

FIG. 2 illustrates a further inventive solution. In this arrangement, it is not the gas inlets which are designed in an aimed distributed manner, but rather the arc discharges.

Components illustrated in FIG. 2 which are similar to components in FIG. 1 are identified by similar reference numerals.

A hot cathode chamber arrangement 23a in coating chamber 1 which is of a cubic shape, has process gas R is fed thereto via a supply line 41 which is perforated at spaced intervals such that the process gas R is in this case not distributed over an area but is distributed in a linear fashion, i.e. at linearly spaced intervals. The hot cathode chamber arrangement 23a extends along a wall of a parallelepiped portion of the chamber 1. One or a plurality of hot cathodes 25 are distributed in two perpendicular directions, over a given area.

The cathode chamber arrangement 23a which obviously can also be formed by individual, separated chambers which are distributed accordingly, communicates via a plurality of orifice openings 21a with the reaction space V of the chamber 1. A rectangular-shaped or square-shaped anode 27a is located in chamber 1 opposite orifices 21a. A screen 3 for supporting the objects to be coated is arranged mutually to the directions of discharge. Line 19 is located at the side of the parallelepiped facing towards the process gas supply 41. The plurality of arc discharges which are distributed in two dimensions, i.e. over a given area, lead along planes $E_B$ to a sufficiently uniform coating for a number of coating demands in spite of the fact that the in-feed of process gas is distributed over a given area. The uniformity of the coating can be influenced by selected predetermined distribution of discharges. $E_3$ refers to planes along which the density of the plasma is substantially constant for equally distributed and equally operated anode/cathode arrangements.

The spatial distribution of the plasma in the reaction space is influenced by a selected areal or spatial distribution and/or selected controlling of respective single anode/cathode sets or groups of anode/cathode sets. Accordingly, it is possible that at the reactive treatment processes or chamber, spatial treatment distribution by means of the described long low voltage arc discharges can be set either by a desired large areal distribution of the process gas inlets and/or by a desired spatial distribution of the arc discharges, such that the objects to be coated and having large surfaces or simultaneously a large number of objects can be treated, with a desired distribution of the treatment, and also three-dimensionally. The arc discharges in FIG. 2, for example, can also be generated in a distributed manner by spark chambers of the type shown in FIG. 1b.

It may now be seen that the two inventive measures according to FIG. 1 and FIG. 2 may preferably be combined in that the gas inlet is provided with a selected areal distribution, and also the arc discharges are provided with a selected spatial distribution. Hereinafter such a preferred arrangement will be described, which the person skilled in the art recognizes without further ado when considering FIGS. 1 and 2 in a combined manner. This is also the case for the combination of both methods practiced by the arrangements of FIGS. 1 and 2.

It has been recognized that the above-mentioned, two-dimensionally uniform treating, for example, the coating distribution achieved in accordance with FIG. 1 and FIG. 2 respectively proceeds into a three-dimensional uniform distribution if the anode/cathode direction and the direction of the gas consumption set predominantly by inlet means and outlet means are mutually equal or opposite.

Figure 3:
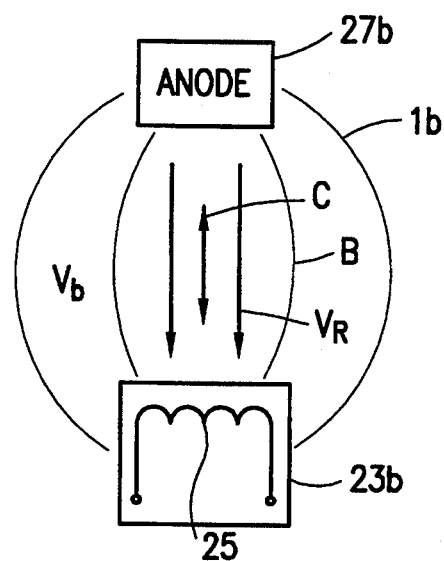
FIG. 3 illustrates an inventive combination of the procedures according to FIGS. 1 and 2, shown in schematic block diagram form.

This procedure is illustrated in principle in FIG. 3, in which an arc discharge B extends between a hot cathode arrangement 23b and an anode arrangement 27b in a substantial volume area of a reaction space $V_b$ of a treatment chamber 1b in the same direction C as the direction $V_R$ of the consuming of the reaction gas in the region between the process gas inlet and the draw off. Such preferred embodiments shall now be disclosed which embodiments shall illustrate combining the procedures according to FIGS. 1, 2 and 3.

Figure 4:
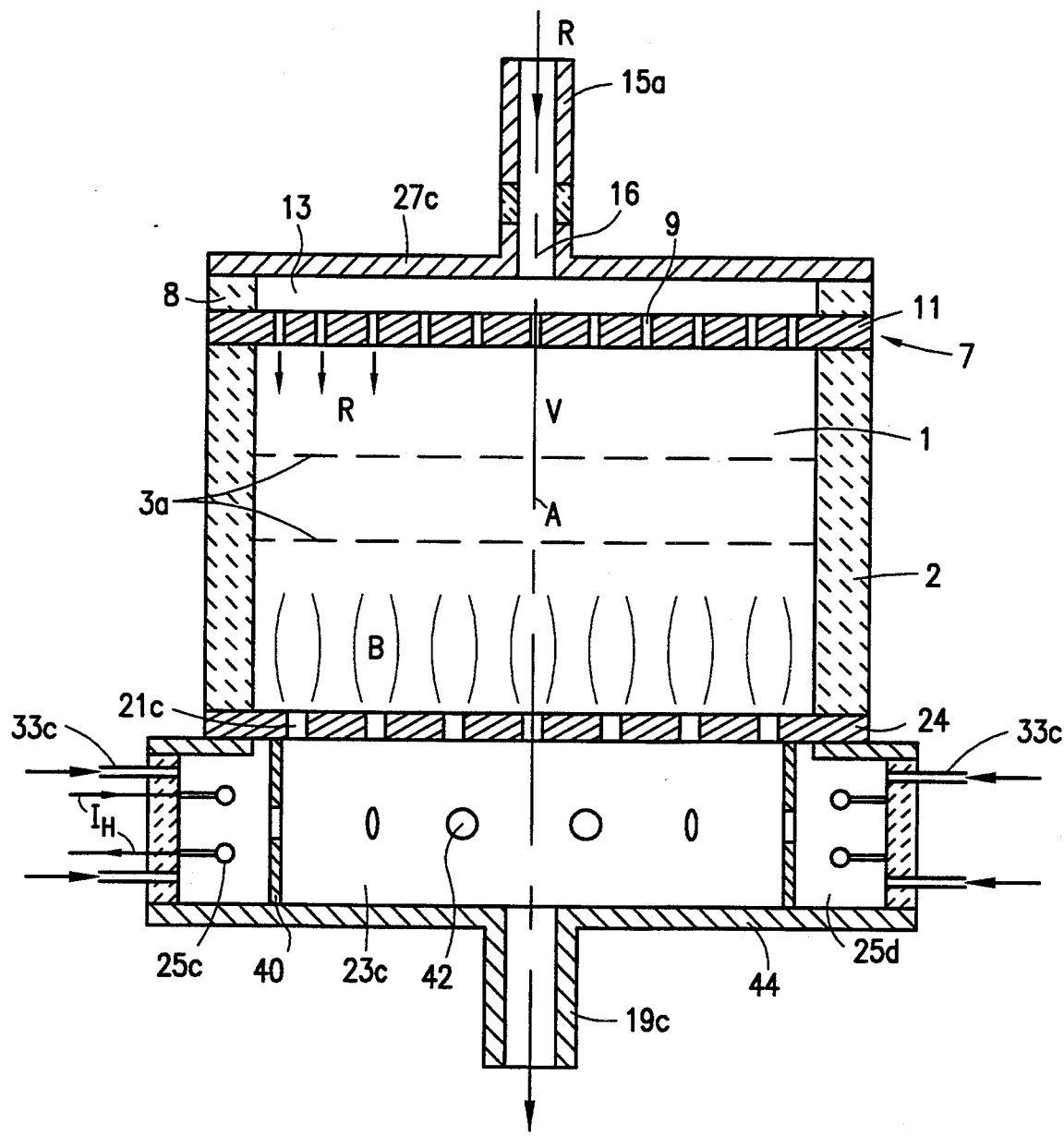
FIG. 4 illustrates schematically a longitudinal section through a preferred embodiment, following the procedure according to FIG. 3.

The basic design of a first variant of such embodiments is illustrated schematically in FIG. 4. The chamber 1 includes a cylinder wall 2 formed of quartz. The reaction space V defined by the wall 2 is limited on the upper end by the inlet arrangement 7 having openings 9 for delivery of fresh process gas R. Pressure distribution chamber 13 located upstream relative to the direction of outflow of fresh gas is defined by an anode plate 27c, an electrically insulated wall section 8 and a plate 11. Fresh process gas R passes through a line connection 15a having a central feed-in 16 through the anode plate 27c and enters into the pressure distribution chamber 13. Anode plate 27c is preferably electrically insulated from connection 15a, as shown.

A plurality of object supports or substrate supporting screens 3a are arranged on separate planes extending substantially perpendicular to the longitudinal axis A of chamber 1. The reaction space V is closed off at the bottom side relative to the gas inlet arrangement by an orifice plate 24 having outlet orifices 21c for the arc discharges B shown in schematic fashion.

An annular-shaped hot cathode chamber 25d is provided adjacent to the orifice plate 24. Chamber 25d contains a directly heated hot cathode coil 25c which extends along the periphery thereof, coil 25c being directly heated by a heating current $I_H$. A low voltage generator (not shown for purposes of simplicity) is connected between the anode plate 27c and the hot cathode 25c. Scavenging gas lines 33c open into the area of the hot cathode 25c by means of which a scavenging gas such as argon or helium is fed into the area occupied by the hot cathode.

The gas entering the region of the hot cathode 25c protects the cathode from the effects of the coating process. This leads to a substantial increase of the useful operating lifetime of the hot cathode.

In the illustrated embodiment the hot cathode 25c is surrounded by a coaxial orifice plate 40 having radially directed openings 42. This arrangement provides a pressure gradient toward the center of the chamber 23c.

At its one face the cathode chamber 23c is closed off by a cover part 44 having a central draw-off line 19c. The orifice plate 24 which is cooled (by means not illustrated), can however also consist of a high temperature resistant material such as tantalum or a high temperature resistant ceramic. The orifice screen or orifice plate 40 is preferably also made of such a material.

The plate 7 can directly be used as the anode, namely, in cases when the desired treatment process allows the plate 7 to be made of metal.

As was already mentioned, the process gas R passes through the inlet openings 9, preferably in a uniformly distributed manner, and enters into the reaction space V. The arc discharge is maintained by the uniformly distributed orifice openings 21c and also the openings 9 of the arrangement 7 by the anode 27c. At the same time gaseous reaction products flow through the orifice openings 21c in a counter current fashion relative to the electron flow of the arc discharge, and through the central area of the cathode chamber 23c and out of the chamber through draw-off line 19c.

The workpieces or the objects are placed upon substrate supporting screens 3a which are maintained, for example, at a floating potential or, in order to respectively regulate or control the temperature, are connected via a current branch such as explained based on FIG. 1a to either a reference potential or a control voltage source.

Figure 5:
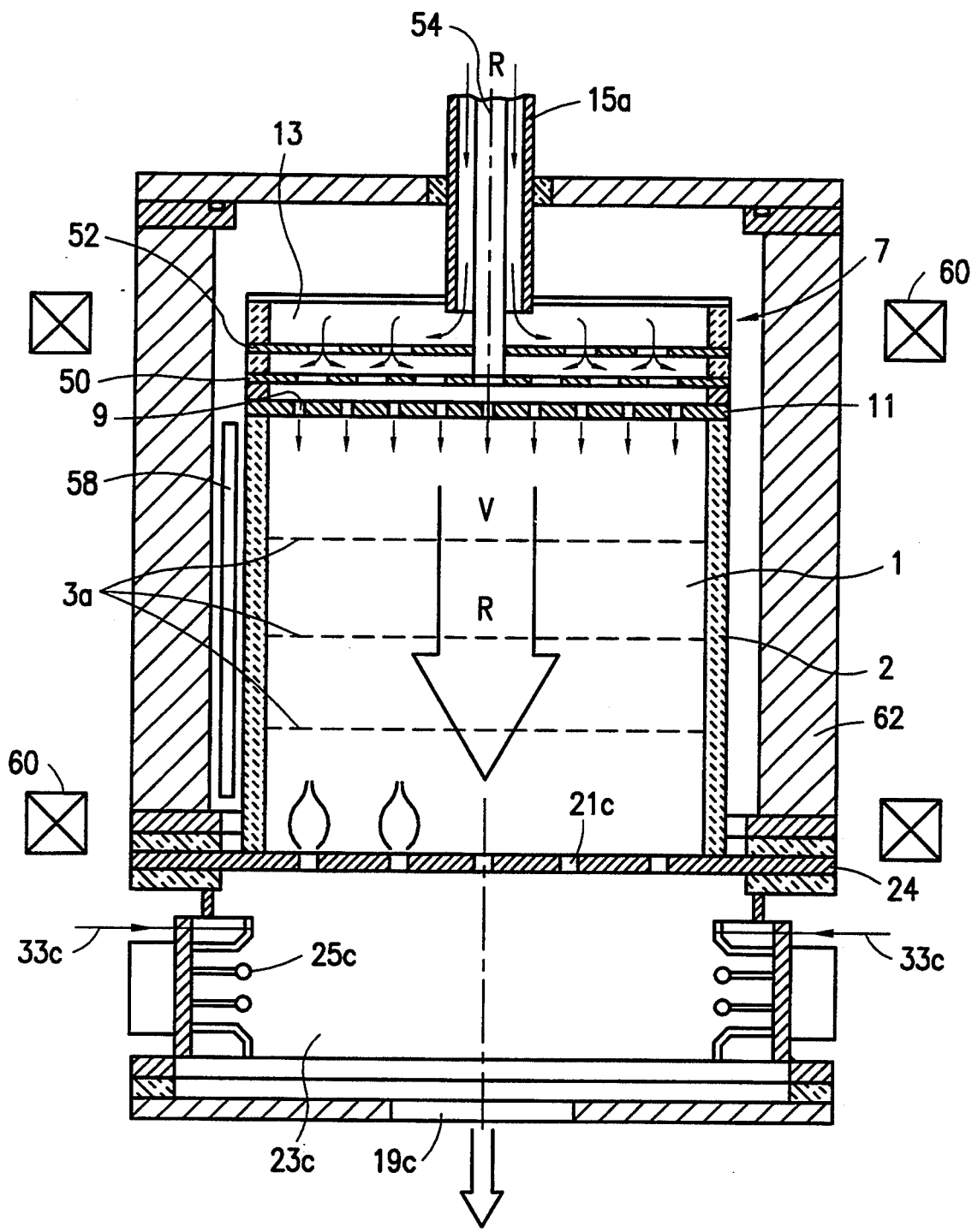
FIG. 5 illustrates in detail a variant of an embodiment in a longitudinal section according to FIG. 4, as is presently used.

FIG. 5 illustrates in a more detailed manner a presently preferred variant of an embodiment of an inventive treatment chamber. In the description thereof previously described parts shown in FIG. 4 are identified by like reference numerals.

The chamber 1 with the wall 2 is closed off at one end by the inlet arrangement 7. Inlet plate 11 has inlet openings 9 for the process gas, and in this instance, is made of quartz. A cooled anode plate 50 perforated by relatively large diameter openings is located a spaced distance from the plate 11 and is electrically insulated as shown. Perforated plate 52 which is arranged a spaced distance from the anode perforated plate 50 serves to provide an improved distribution of the gas. The electrical supply 54 for the anode is located along the central axis of the central process gas supply tube 15a.

The pressure distribution chamber is formed by two pressure stages between the two distribution plates 52 and 11. The anode plate 50 is designed to provide as little disturbance as possible, i.e., to be "transparent" for the process gas, in order not to disturb the flow of the gas, and to be detrimentally influenced by the gas as little as possible.

By means of this arrangement an optimal, homogeneous distribution of the gas arrives at the uniformly distributed gas inlets 9, which are all of the same size, and in the same instance a cooling of the anode 50 is achieved.

Optionally, heating rods 58 may be provided outside of the chamber 1, or depending upon the needed power, cooled screening plates may also be provided.

Magnet coils 60 may be provided outside of chamber 1. Coils 60 are arranged coaxial to the anode/cathode set and, by means of either d.c. or alternating magnet fields, optimize the distribution of the plasma in the reaction space V containing the supports 3a.

The outer chamber containing the optical heaters 58 is closed off by an outer wall 62.

Figure 6:
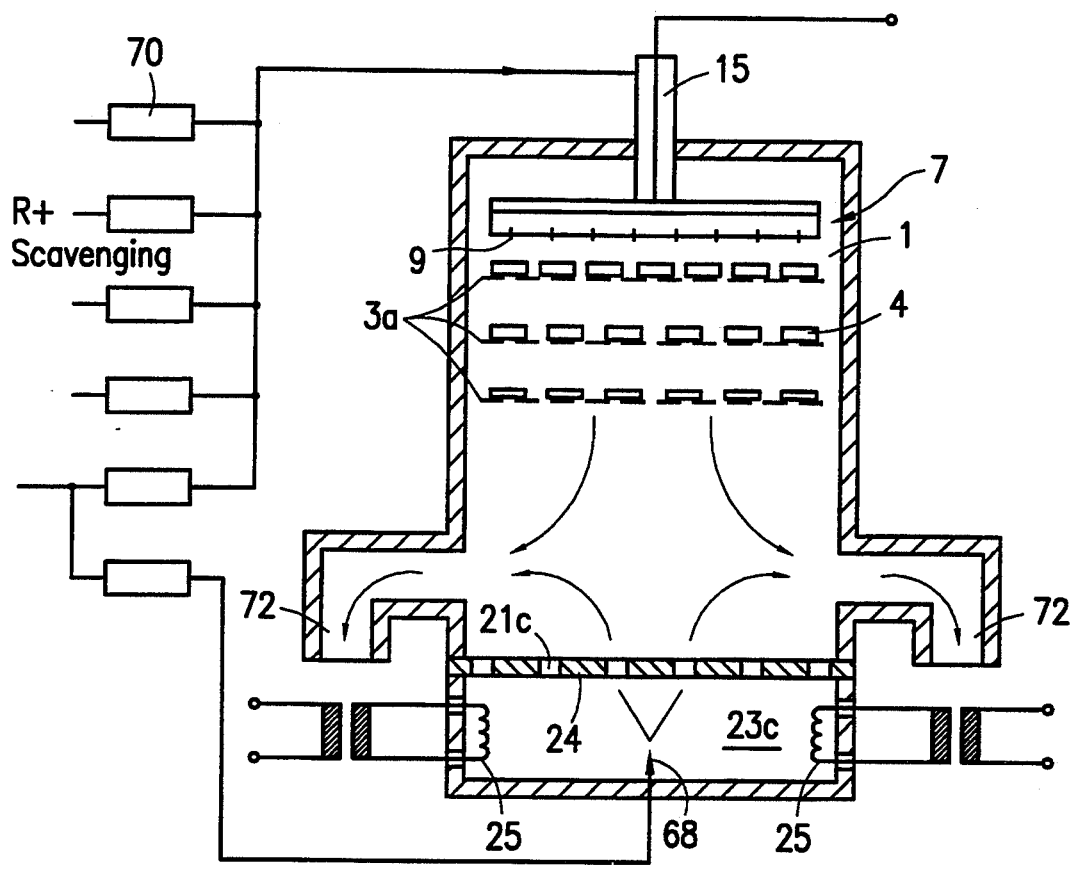
FIG. 6 illustrates a further variant of an embodiment of an inventive arrangement following the principle of FIG. 3 and in part corresponding to the embodiment of FIGS. 4 and 5.

FIG. 6 illustrates an inventive treatment chamber, in which scavenging gas enters through inlet 68 schematically illustrated. The process gas enters through the inlet 15. Scavenging gas and/or process gas is drawn off through the peripherally located outlets (see arrow 72). The previously used reference numerals are used again in FIG. 6 so that FIG. 6 can be understood by the person skilled in the art without any further ado.

By appropriate design of the openings respectively in the orifice and distribution plate 24 a pressure is set in the ionization or cathode chamber respectively which is larger than the pressure in the treatment space. By this means a specifically effective ionization of the gas is achieved. Because the gas in the ionization chamber 23c is substantially a noble gas, the useful lifetime of the cathode arrangement 25 is significantly increased.

The objects to be treated are illustrated schematically and are located on carriers 3a. The reference numeral 70 identifies generally gas flow controllers for the process gas R delivered to the connection 15, and also identifies gas flow controllers for delivering scavenging gas supplied to the supply line 68.

The gas drawing off proceeds at the draw-off connections as shown by arrows 72.

The following dimensions which are relatively critical values have proven themselves up to now positively:

density distribution $D_{21}$ of the opening 21c in the orifice plate 24: $D_{21} \leq 10/m^2$; preferably $D_{21} \geq 50/m^2$;

diameter $\Phi_{21}$ of the openings 21c in the orifice plate 24: $1 \text{ mm} \leq \Phi_{21} \leq 8 \text{ mm}$;

density $D_9$ of the openings 9 in the plate 7: $D_9 \geq 500/m^2$, preferably $D_9 \geq 2000/m^2$;

diameter $\Phi_9$ of the openings 9 in the distribution chamber 7: $0.5 \text{ mm} \leq \Phi_9 \leq 10 \text{ mm}$.

Figure 7:
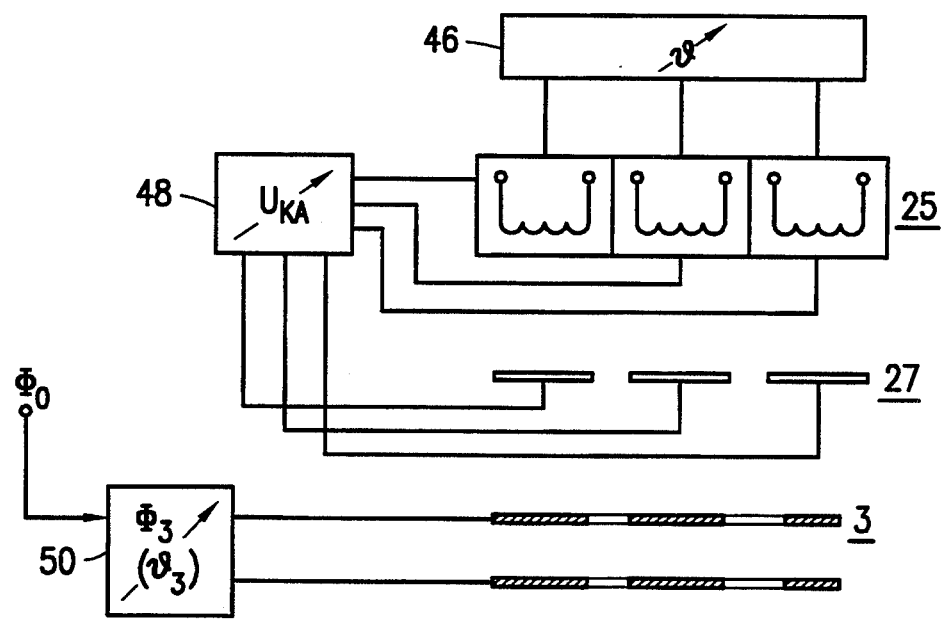
FIG. 7 illustrates schematically the electrically operated devices of an inventive arrangement and their inventive setting or control.

FIG. 7 illustrates schematically the electrically operated parts of the inventive arrangement. These include one or more hot cathodes 25, one or more anodes 27 and one or more supports 3 for objects to be treated.

One or more of the following values may be adjusted for an optimizing of the treatment process:

In the case where more than one hot cathode 25 is provided, their operating temperatures, in the case of directly heated hot cathodes are set by setting their heating current. The heating current may, for example, be selectively set to optimize the distribution of the arc discharge. This is realized by an operation temperature control unit 46.

If more than one anode 27 and more than one hot cathode 25 are present and in an analogous manner, if one hot cathode and more than one anode or one anode and more than one hot cathode, respectively are provided, the respective low voltage values of the anode/cathode voltages $U_{KA}$ may be set selectively at a control unit 48 for optimizing the arc discharge distribution.

The electrical operating potentials of the supports 3 which in this case consist at least of sections of a conductive material, are influenced at a selective adjusting unit 50, which may include voltage sources 39 according to FIG. 1a and/or adjust the value of the resistance in a current branch 35 according to FIG. 1a, to obtain a fine adjustment of the temperature of the object being treated or of the electron bombardment of a growing coating, respectively.

The illustrated coating arrangement for reactive, low voltage arc plasma enhanced treatments operate at low anode/cathode voltages, for instance below 150 V, and can be operated with high discharge currents per commodity support surface area, for instance more than 4000 A/m$^2$ and lead to low treatment temperatures, substantially below 900° C. The high plasma densities at low treatment temperatures reached lead to a plurality of applications.

Although the disclosed method and the apparatus therefore are basically suitable for reactive, arc plasma enhanced treatment methods, they are specifically suitable for such coating methods.

While there are shown and described present preferred embodiments of the invention, it is distinctly understood that the invention is not limited thereto, but may be otherwise variously embodied and practiced within the scope of the following claims and separate portions may be used separately.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. A vacuum treatment arrangement comprising a vacuum chamber having an inlet opening means and means for introducing a process gas into said vacuum chamber through said inlet opening means to react in the vacuum chamber, an exhaust means for removing gaseous reaction products from said vacuum chamber, means for introducing a flow of electrically charged particles into the vacuum chamber, an electrode arrangement for generating a direct voltage arc discharge in the vacuum chamber, said inlet opening means further comprising a plurality of inlet openings distributed over a given area, said means for introducing a flow of electrically charged particles comprising barrier means having a plurality of distribution openings communicating with a inner space of the vacuum chamber for producing arc discharge over a given area;

said means for introducing a flow of electrically charged particles further comprising thermal-type electron-emitting means for producing a flow of electrically charged particles, said barrier means separating said thermal-type electron-emitting means from the inner space of the chamber;

said thermal-type electron-emitting means comprising a directly heated hot cathode;

said hot cathode being an electrode, and preferably, the cathode electrode of the electrode arrangement; and at least a part of at least one of the inlet opening means and the exhaust means being a perforated plate arranged so that charged particles and process gas flow through the perforated plate.

2. A vacuum treatment arrangement comprising a vacuum chamber having an inlet opening means and means for introducing a process gas into said vacuum chamber through said inlet opening means to react in the vacuum chamber, an exhaust means for removing gaseous reaction products from said vacuum chamber, means for introducing a flow of electrically charged particles into the vacuum chamber, an electrode arrangement for generating a direct voltage arc discharge in the vacuum chamber, said inlet opening means further comprising a plurality of inlet openings distributed over a given area, said means for introducing a flow of electrically charged particles comprising barrier means having a plurality of distribution openings communicating with an inner space of the vacuum chamber for producing arc discharge over a given area;

said means for introducing a flow of electrically charged particles further comprising thermal-type electron-emitting means for producing a flow of electrically charged particles, said barrier means separating said thermal-type electron-emitting means from the inner space of the chamber; and said vacuum chamber being an axially symmetrical, cylindrical-shaped housing having face sides at opposite ends of said housing, whereby the electrodes of the electrode arrangement for the discharge are each located opposite an associated one of the face sides.

3. A vacuum treatment arrangement comprising a vacuum chamber, process gas inlet opening means including a plurality of openings for introducing into said vacuum chamber a process gas for reacting at least partially in said vacuum chamber, exhaust means including a plurality of openings for exhausting gaseous reaction products from said vacuum chamber, charged particle inlet opening means and means for introducing a flow of electrically charged particles into said vacuum chamber through said charged particle inlet opening means, an electrode arrangement in said vacuum chamber and having at least one cathode and at least one anode, defining therebetween a discharge space for generation of a DC arc discharge in said vacuum chamber, said process gas inlet opening means and said exhaust means being arranged to provide a flow of gas in a given direction relative to said electrode arrangement so that the direction of flow of gas between said process gas inlet opening means and said exhaust means is substantially parallel with an imaginary line representing said DC arc discharge in said discharge space and extending between said cathode and said anode, said means for introducing a flow of electrically charged particles including a thermal-type electron emitting means for producing a flow of electrically charged particles into said chamber and barrier means for separating said thermal-type electron emitting means from an inner space of the vacuum chamber containing said electrode arrangement.

4. The arrangement of claim 3 comprising:
at least one support for an object to be treated which support is connected via a resistance element to an electrical potential.

5. The arrangement of claim 4 in which the resistance element is adjustable.

6. The arrangement of claim 4 in which the resistance element is a control member in a temperature feedback control circuit for the object for providing a temperature open-loop control for the temperature of the object being treated.

7. The arrangement of claim 4 in which the resistance element is a control member in a temperature feedback control circuit for the object for providing a flow of electrons impinging upon the object being treated.

8. The arrangement of claim 3 comprising:
at least one object support for objects to be treated which support is connected to a controllable voltage source to obtain a reference potential.

9. The arrangement of claim 8 in which the voltage source forms a control member for the temperature of the object being treated for the regulating or feedback control, i.e. open-loop control.

10. The vacuum treatment arrangement according to claim 3, wherein said process gas inlet opening means comprise inlet openings distributed at spaced intervals along a substantially linear path extending in a given direction.

11. The vacuum treatment arrangement according to claim 3, wherein said process gas inlet opening means includes openings distributed over a surface area so that the openings are arranged at spaced intervals along two mutually perpendicular directions.

12. The vacuum treatment arrangement according to claim 3, wherein said exhaust means comprises exhaust openings distributed at spaced intervals along a path extending in a given direction.

13. The vacuum treatment arrangement according to claim 12, wherein said exhaust openings are distributed at spaced intervals over a surface area and along two mutually perpendicular directions.

14. The vacuum treatment arrangement according to claim 3, wherein said charged particle inlet opening means comprises particle inlet openings arranged at spaced intervals along a path extending in a given direction.

15. The vacuum treatment arrangement according to claim 3, wherein said charged particle inlet opening means comprises particle inlet openings arranged at spaced intervals along two mutually perpendicular directions of a surface.

16. The vacuum treatment arrangement according to claim 3, wherein at least one of said gas inlet opening means and said exhaust means comprises gas transfer openings; said charged particle inlet opening means comprising charged particle inlet openings, at least some of said particle inlet openings also serving as gas transfer openings.

17. The vacuum treatment arrangement according to claim 3, further comprising at least one heated electron-emitter means for producing charged particles and being separated from an interior region of said vacuum chamber by said charged particle inlet opening means.

18. The vacuum treatment arrangement according to claim 17 in which said heated electron-emitter means comprises a directly heated filament.

19. The vacuum treatment arrangement according to claim 17, wherein said at least one heated electron-emitter means is a cathode of said electrode arrangement.

20. The vacuum treatment arrangement according to claim 17, in which said at least one heated electron-emitter means comprises an indirectly heated filament.

21. The vacuum treatment arrangement according to claim 20, in which said at least one heated electron-emitter means is a cathode electrode.

22. The vacuum treatment arrangement according to claim 17, in which said at least one electron-emitter means is located in a chamber having an opening which communicates with said process gas inlet opening means.

23. The vacuum treatment arrangement according to claim 3, in which at least one of said process gas inlet opening means and said exhaust means comprises a perforated plate, said plate also being one electrode of said electrode arrangement.

24. The vacuum treatment arrangement according to claim 3, in which at least one of said process gas inlet opening means and said exhaust means comprises a perforated plate which borders a further chamber, in which one electrode of said electrode arrangement is disposed.

25. The vacuum treatment arrangement according to claim 3, in which at least one of said process gas inlet opening means and said exhaust means comprises a perforated plate which borders a further chamber, one electrode of said electrode arrangement being located on said plate.

26. The vacuum treatment arrangement according to claim 3, in which at least one of said process gas inlet opening means, said exhaust means and said particle inlet opening means includes a perforated plate.

27. The vacuum treatment arrangement according to claim 3, wherein at least a part of at least one of said gas inlet opening means, said exhaust means and said charged particle opening means comprises a predetermined arrangement of openings.

28. The vacuum treatment arrangement according to claim 3, wherein said vacuum chamber, said process gas inlet opening means, said exhaust means, said charged particle inlet opening means and said electrode arrangement are substantially in axial symmetry relative to a central axis of said vacuum treatment arrangement.

29. The vacuum treatment arrangement according to claim 28, wherein said process gas inlet opening means, said exhaust means and said electrode means are arranged along respective planes perpendicular to said central axis.

30. The vacuum treatment arrangement according to claim 3, comprising at least one support for an object to be treated in said vacuum chamber and being electrically insulated from all other parts of said vacuum treatment arrangement.

31. The arrangement according to claim 3, comprising at least one support for an object to be treated which is coupled to a current conducting means to be maintained at a predetermined electrical potential.

32. The vacuum treatment according to claim 31, in which said current conducting means includes means for providing an adjustable output current.

33. The vacuum treatment arrangement according to claim 32, in which said means for providing an adjustable output current includes a temperature control member for adjusting a temperature of an object being treated.

34. The vacuum treatment arrangement according to claim 32, in which said means for providing an adjustable output current includes a temperature adjusting means for adjusting a temperature of said object and is coupled to a negative feedback control arrangement for controlling said temperature.

35. The vacuum treatment arrangement according to claim 32, wherein said means for providing an adjustable output current comprises a resistance element.

36. The vacuum treatment arrangement according to claim 32, wherein said current conducting means comprises a voltage source.

* * * * *